United States Patent
Kordik et al.

(10) Patent No.: US 9,258,000 B1
(45) Date of Patent: Feb. 9, 2016

(54) COMBINED LOCK/OUT-OF-LOCK DETECTOR FOR PHASE LOCKED LOOPS

(71) Applicant: Infineon Technologies AG, Neubiberg (DE)

(72) Inventors: Klemens Kordik, Linz (AT); Thomas Sailer, Zwettl (AT); Rainer Stuhlberger, Puchenau (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/493,539

(22) Filed: Sep. 23, 2014

(51) Int. Cl.
*H03L 7/095* (2006.01)

(52) U.S. Cl.
CPC ..................... *H03L 7/095* (2013.01)

(58) Field of Classification Search
CPC ....................................................... H03L 7/095
See application file for complete search history.

(56) References Cited

U.S. PATENT DOCUMENTS

| | | | | |
|---|---|---|---|---|
| 6,320,469 B1* | 11/2001 | Friedberg | ................ | H03L 7/095 327/156 |
| 6,794,944 B2* | 9/2004 | Hirai | ..................... | H03L 7/0891 331/1 A |
| 7,424,082 B2* | 9/2008 | Choi | ....................... | H03L 7/095 375/371 |
| 8,076,979 B2* | 12/2011 | Kathuria | ................. | H03L 7/095 327/156 |
| 8,169,242 B2* | 5/2012 | Abbasi | .................. | H03L 7/0891 327/147 |
| 8,368,439 B2* | 2/2013 | Jang | ........................ | H03L 7/095 327/147 |
| 2008/0116983 A1* | 5/2008 | Kinugasa | ................ | H03L 7/095 331/25 |

* cited by examiner

*Primary Examiner* — Patrick O'Neill
(74) *Attorney, Agent, or Firm* — Eschweiler & Associates, LLC

(57) ABSTRACT

A detector for detecting a locked state and an out-of-lock state of a phase locked loop includes an out-of-lock detector circuit that receives a reference signal and an input signal representing a PLL oscillator signal. The out-of-lock detector detects an out-of-lock state of the PLL and generates an out-of-lock signal indicating whether an out-of-lock state is detected. The detector further includes a lock detector circuit that receives the reference signal and the input signal, detects a locked state of the PLL, and generates a lock signal indicating whether a locked state is detected. A logic circuit receives both the out-of-lock signal and the lock signal and combines both signals to obtain an output signal indicative of whether the PLL is in a locked state or an out-of-lock state.

18 Claims, 3 Drawing Sheets

COMBINED LOCK/OUT-OF-LOCK DETECTOR FOR PHASE LOCKED LOOPS

FIELD

The present disclosure relates to the field of radio frequency (RF) transceiver circuits.

BACKGROUND

Radio frequency (RF) transceiver can be found in numerous applications, particularly in the field of wireless communications and radar sensors. In the automotive sector, there is an increasing demand for radar sensors used in so-called "adaptive cruise control" (ACC) or "radar cruise control" systems. Such systems may be used to automatically adjust the speed of an automobile so as to maintain a safe distance from other automobiles ahead.

Modern radar systems make use of highly integrated RF circuits, which may incorporate all core functions of an RF front-end of a radar transceiver in one single package (single chip transceiver). Such RF front-ends may include, inter alia, a voltage controlled oscillator (VCO), power amplifiers (PA), mixers, and analog-to-digital converters (ADC). However, not all of these components have to be necessarily in one single chip package. For example, ADCs may be integrated in a separate chip. Particularly in frequency-modulated continuous wave (FMCW) radar systems, the VCO is typically operated in a phase-locked loop (PLL). However, PLLs may be used in many other applications.

Radar applications used in automobiles are subject to various standards concerning road traffic safety, for example the functional safety standard ISO 26262 titled "Road vehicles—Functional safety". To ensure the functional safety of a radar sensor, it is important to know whether the current state of the radar sensor allows a reliable distance and speed measurement. Particularly underestimating the true distance to a vehicle ahead and its speed may cause dangerous traffic situations.

In a radar system the operating state of the PLL used in the radar transceiver is a critical parameter. For a reliable measurement, the PLL should be in a locked state. That is, the PLL output signal is in phase with (i.e. locked to) a reference signal. If the PLL is in an "out-of-lock" state, any measurement results are unreliable, and therefore it may be important to know, whether the PLL is in a locked state or in an out-of-lock state. To improve functional safety, a lock/out-of-lock detector should provide a fast detection of an out-of lock state as well as precise detection of the locked state, which imposes a conflict of objectives on the circuit designer.

SUMMARY

A detector for detecting a locked state and an out-of-lock state of a phase locked loop (PLL) is disclosed. In accordance with the embodiments described herein, the detector includes an out-of-lock detector circuit that receives a reference signal used by the PLL and an input signal representing a PLL oscillator signal. The out-of-lock detector is configured to detect an out-of-lock state of the PLL and generates an out-of-lock signal indicating whether an out-of-lock state is detected. The detector further includes a lock detector circuit that receives the reference signal and the input signal, is configured to detect a locked state of the PLL, and generates a lock signal indicating whether a locked state is detected. A logic circuit receives both, the out-of-lock signal and the lock signal and is configured to combine both signals to obtain an output signal indicative of whether the PLL is in a locked state or an out-of-lock state.

Furthermore, a method for monitoring a phase locked loop is described, wherein the phase locked loop comprises a frequency divider for providing an input signal based on an oscillator signal. In accordance with one example of the present disclosure the method includes determining whether pulses of the input signal and corresponding pulses of the reference signal coincide within a given range of tolerance. An out-of-lock state of the phase locked loop is signaled, when the corresponding pulses do not coincide. The method further includes counting the pulses of the input signal during a time window. A lock state of the phase locked loop is signaled when the counted number of pulses is within a predefined interval.

BRIEF DESCRIPTION OF THE DRAWINGS

The disclosure can be better understood with reference to the following drawings and descriptions. The components in the figures are not necessarily to scale; instead emphasis is placed upon illustrating the principles of the disclosure. More-over, in the figures, like reference numerals designate corresponding parts. In the drawings.

DETAILED DESCRIPTION

Figure 1:
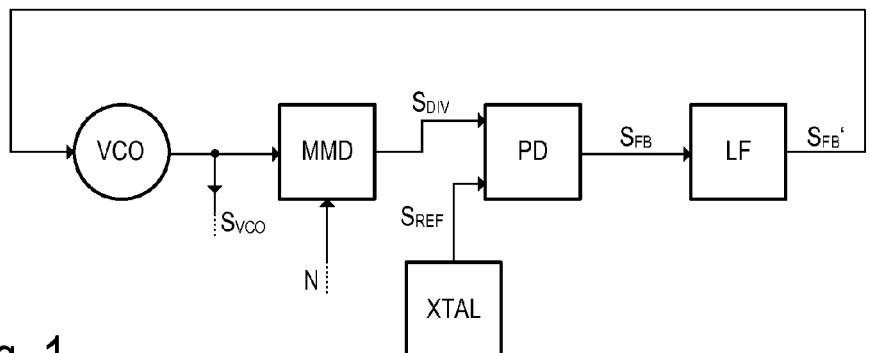
FIG. 1 is a block diagram one exemplary implementation of a phase-locked loop (PLL)

FIG. 1 illustrates, as an illustrative example, a phase locked loop (PLL) as commonly used, for example, in RF transceivers of FMCW radar systems. However, PLLs and further circuitry described herein may also be employed in other RF applications. The PLL includes a voltage controlled oscillator VCO (or, in a digital implementations, a numerically controlled oscillator, short: NCO) which generates an oscillating output signal $S_{VCO}$ having an frequency, which is denoted as $f_{VCO}$ and set in accordance with a control signal $S_{CTL}$ supplied to a control input of the oscillator VCO. The oscillator output signal $S_{VCO}$ is supplied to a frequency divider MMD having a selectable division ratio N (so-called multi-modulus divider). That is, the frequency divider MMD is configured to divide the frequency $f_{VCO}$ supplied to its input and to generate a divider output signal $S_{DIV}$ having a frequency denoted as $f_{DIV}$, wherein $f_{VCO}=N \cdot f_{DIV}$. The division ratio is selectable dependent on a select signal supplied to a select input of the frequency divider MMD. Dependent on the application a fractional-N divider may be used. In this case, the division ratio N may be a fractional number.

The divider output signal $S_{DIV}$ as well as a reference signal $S_{REF}$, which has a frequency $f_{REF}$, are supplied to a phase detector PD (also known as phase comparator). Dependent on the implementation a phase-frequency-detector PFD may be employed instead. Phase detectors as well as phase-frequency detectors are commonly used in the field of PLLs. The reference signal $S_{REF}$ may be provided by a reference oscillator, which usually is (but not necessarily has to be) a crystal oscillator denoted herein as XTAL. That is, the frequency $f_{REF}$ may be determined by the resonance frequency of a quartz crystal oscillator.

The phase (-frequency) detector P(F)D usually includes a charge-pump at its output, which generates (as output signal) an error signal, which is denoted as $S_{ERR}$ and filtered by a loop filter LF, which determines the band-width of the control loop. The output of the loop filter is used as control signal $S_{CTL}$ to adjust the frequency $f_{VCO}$ and the phase of the oscillator output signal $S_{VCO}$ thus closing the control loop. The closed loop ensures that the frequency $f_{VCO}$ is tuned to such a value that the phases of the divider output signal $S_{DIV}$ and the reference signal $S_{REF}$ match (i.e. are in a defined and fixed relation to each other). That is, the divider output signal $S_{DIV}$ (and thus also the oscillator signal $S_{VCO}$) is "locked" to the reference signal $S_{REF}$, and the PLL is in a "locked state". The oscillator signal $S_{VCO}$ is also the output signal of the PLL. Various implementations of phase (-frequency) detector P(F)D including charge-pumps are as such known in the art and thus not further discussed herein in more detail.

As mentioned above, a PLL operating in a locked state may fall "out-of-lock" (i.e. into an unlocked state) due to various reasons such as, for example, noise, jitter, and other disturbances. As mentioned above, the operating state of the PLL is a critical parameter in many applications such as, for example, in radar transceivers used for measuring distances and velocities. For a reliable measurement, the PLL should be in a locked state. That is, the PLL output signal $S_{VCO}$ is in phase with (i.e. locked to) the reference signal $S_{REF}$. If the PLL is in an "out-of-lock" state, any measurement results are unreliable and probably have to be discarded. To improve functional safety of the overall system, it may be important to know, whether the PLL is in a locked state or in an out-of-lock state. For this purpose, a PLL may include a lock/out-of-lock detector, which indicates (by generating an appropriate output signal) whether or not the PLL is in a locked state. Generally, such lock/out-of-lock detectors may be regarded as part of the phase detector PD. In accordance with the embodiments described herein, lock detector and out-of-lock detector are separated to allow a fast out-of-lock detections and a precise lock detection. The outputs of the separate lock and out-of-lock detectors may then be combined to form one signal indicative of the operating state (lock or out-of-lock) of the PLL.

Figure 2:
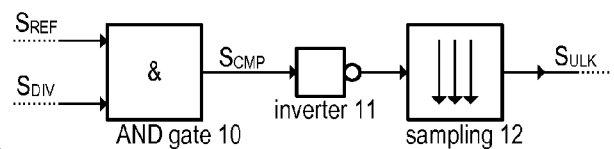
FIG. 2 is a block diagram illustrating one example of an out-of-lock detector.

FIG. 2 illustrates one example of an out-of-lock detector 2, which allows a very fast detection of an out-of-lock state. This allows a very fast reaction when the PLL falls out-of-lock. As mentioned, the out-of-lock detector may be regarded as part of the phase detector PD. However, it may also be implemented separately from the phase detector. The out-of-lock detector circuit 2 receives the reference signal $S_{REF}$ from the crystal oscillator XTAL and the frequency divider output signal $S_{DIV}$ as input signals. The out-of-lock detector circuit 2 is configured to generate a signal $S_{CMP}$, which may be a logical conjunction of the two input signals $S_{REF}$ and $S_{DIV}$. Alternatively, the signal $S_{CMP}$ may be the result of a comparison of the levels of the input signals $S_{REF}$ and $S_{DIV}$. In the present example, the input signals $S_{REF}$ and $S_{DIV}$ are supplied to the inputs of an AND gate 10, wherein the output of AND gate 10 is inverted by an inverter 11, which provides the signals $S_{CMP}$. In essence, a logical NAND conjunction is implemented. In the present example of FIG. 2, signal $S_{CMP}$ is the result of the operation $S_{DIV}$ NAND $S_{REF}$, the signal $S_{CMP}'$ is the result of the operation $S_{DIV}$ AND $S_{REF}$.

Figure 3:
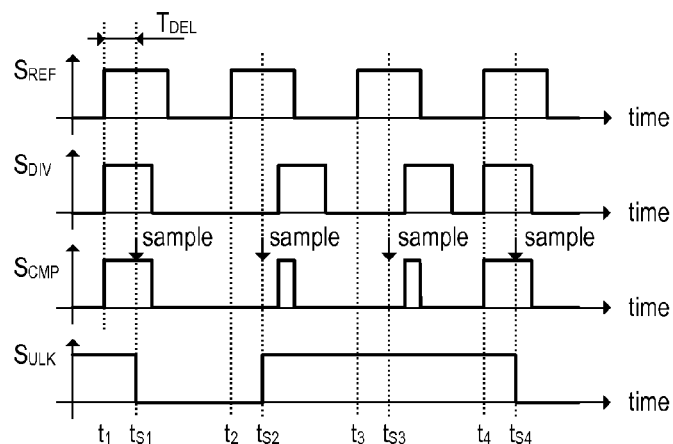
FIG. 3 includes a set of timing diagrams illustrating the operation of the out-of-lock detector of FIG. 2.

The resulting signal $S_{CMP}$ is sampled synchronously to the reference signal $S_{REF}$ (sampling unit 12). In the present example, the reference signal $S_{REF}$ has a duty cycle of 50 per cent, and the sampling time instances $t_{S1}$, $t_{S2}$, $t_{S3}$, $t_{S4}$ for sampling the signal $S_{CMP}$ are a delay time interval $T_{DEL}$ after a corresponding rising edge in the reference signal $S_{REF}$. This situation is illustrated by the timing diagrams of FIG. 3, in which the time instances, at which rising edge occur in the reference signal $S_{REF}$, are denoted with $t_1$, $t_2$, $t_3$, and $t_4$. With respect to the periodicity of the reference signal, the sampling time instances $t_{S1}$, $t_{S2}$, $t_{S3}$, $t_{S4}$ are phase shifted by 90 degrees. However, the delay time $T_{DEL}$ may vary dependent on the actual implementation. Generally, it is determined whether or not corresponding pulses of the reference signal $S_{REF}$ and the second input signal $S_{DIV}$ coincide within a given range of tolerance. That is, corresponding pulses of signals $S_{REF}$ and $S_{DIV}$ need not necessarily be exactly congruent. In the example of FIG. 3, coincidence of corresponding pulses is detected when both pulses are at a high level (first logic level) at the sampling times $t_{S1}$, $t_{S2}$, $t_{S3}$, $t_{S4}$, etc. Alternatively, coincidence of the low level could be checked. The sampling time instants are determined based on the reference signal. As can be seen from the example of FIG. 3, the mentioned range of tolerance depends on the value of the delay time $T_{DEL}$. However, other circuits implementing a more complex logic to define the range of tolerance may be used.

The first (top) diagram of FIG. 3 illustrates the reference signal $S_{REF}$ provided by the reference oscillator XTAL. The period $T_{REF}$ of reference signal $S_{REF}$ equals $f_{REF}^{-1}$ with the rising edges occurring at time instances $t_1$, $t_2$, $t_3$, and $t_4$ (wherein $T_{REF}=t_4-t_3=t_3-t_2=t_2-t_1$). The oscillation is constant with a comparably low jitter. The second diagram illustrates the frequency divider output signal $S_{DIV}$. Before time instant $t_2$, the signals $S_{DIV}$ and $S_{REF}$ are in phase. At time instant $t_1$ corresponding pulses occur in both signals. However, the second and the third pulse in signal $S_{DIV}$ are "late" and occur significantly after the corresponding pulses of reference signals $S_{REF}$ at time instants $t_2$ and $t_3$, respectively. Thus, the PLL is out-of-lock at least after time instant $t_2$. The third diagram illustrates the signal $S_{CMP}$, which is a logical conjunction (AND operation) of signals $S_{REF}$ and $S_{DIV}$. Due to the sampling (sampling unit 12), the signal $S_{CMP}$ (or $S_{CMP}'$) is only evaluated at the sampling times $t_{S1}$, $t_{S2}$, $t_{S3}$, $t_{S4}$, etc. If the pulses of the reference signal $S_{REF}$ and the frequency divider output signal $S_{DIV}$ coincide the signal level should be the same at the sampling times $t_{S1}$, $t_{S2}$, $t_{S3}$, $t_{S4}$. As soon as the signal levels are different at a sampling time instant (time instant $t_{S2}$ in FIG. 3) an out-of-lock state is detected. As a result of the AND conjunction the signal $S_{CMP}$ is indicative of whether the signal levels of signals $S_{REF}$ and $S_{DIV}$ match at the time of sampling. The fourth (bottom) diagram of FIG. 3 illustrates the output signal (out-of-lock-signal $S_{OLK}$) of the sampling unit 12, wherein the signal level sampled at one time instant is held until the subsequent sampling time instant. Assuming the PLL is in a lock state before time instant $t_1$, the out-of-lock-signal $S_{OLK}$ is low before sampling time instant $t_{S1}$. At sampling time instant $t_{S1}$ the signal $S_{CMP}'$ is at a high level (and $S_{CMP}$ is low) indicating that the levels of the signals $S_{REF}$ and $S_{DIV}$ match and the PLL is still in a locked state. At the next sampling time $t_{S2}$ the pulses in signals $S_{REF}$ and $S_{DIV}$ do not coincide and thus the level of signal $S_{CMP}'$ is low indicating that the levels of signals $S_{REF}$ and $S_{DIV}$ do not match and the PLL is in an out-of-lockstate. As a result, the out-of-lock-signal $S_{OLK}$ changes to a high level for signaling the detected out-of-lock state. The situation is the same at time instant $t_{S3}$, and thus signal $S_{OLK}$ remains high. At time instant $t_4$ the pulses in signals $S_{REF}$ and $S_{DIV}$ again coincide and thus their level match at sampling time instant $t_{S4}$. Signal $S_{CMP}$' is at a high level at sampling time instant $t_{S4}$ (and $S_{CMP}$ is low) and the out-of-lock-signal $S_{OLK}$ is set back to a low level, indicating that no out-of-lock state is detected (anymore).

As shown in FIG. 3, the out-of-lock detector is able to detect an out-of-lock state of the PLL very quickly, and in the best case within a single period $f_{REF}^{-1}$ of the reference signal $S_{REF}$. However, a locked state is detected with high precision. As can be seen from FIG. 3, the temporal position of the pulses in the frequency divider output signal $S_{DIV}$ (relative to the reference signal $S_{REF}$) may vary up to a time $T_{DEL}$ without an out-of-lock state being detected. As long as the signal levels of signals $S_{REF}$ and $S_{DIV}$ are the same at the time of sampling, an out-of-lock state is not detected. That is, the out-of-lock detector may be used for quickly detecting an out-of-lock state but the precision is not sufficient for detecting when the PLL is again in a locked state.

Figure 4:
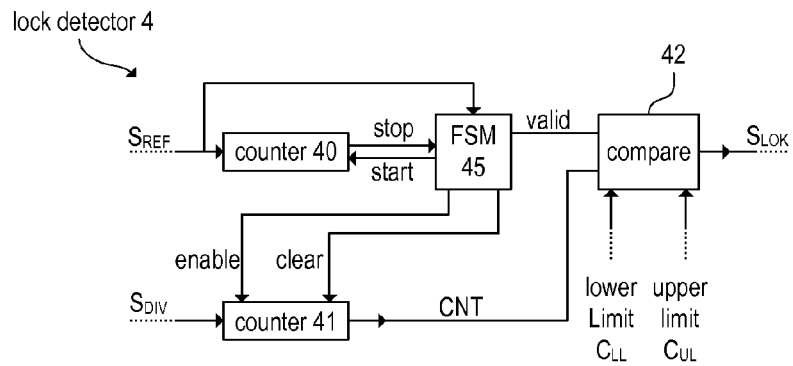
FIG. 4 is a block diagram illustrating one example of a lock detector.

To accomplish a precise detection of a locked state of a PLL (such as the PLL shown in FIG. 1), the lock detector circuit of FIG. 4 may be used. Basically, the lock detector circuit 4 is configured to count the number of pulses present in the frequency divider output signal $S_{DIV}$ within a defined time window (window length $T_{CNT}$, see FIG. 5) and to check whether or not the counted number of pulses is within a given range, which is, in the present example, defined by an upper and a lower counter limit $C_{UL}$, $C_{LL}$. The frequency divider output signal $S_{DIV}$ is supplied to an input of counter 41, which counts the pulses in the frequency divider output signal $S_{DIV}$. In the present example, the counter value CNT is increased each time a rising edge is detected at the counter input of counter 41 during the mentioned time window. When the counter value is valid (i.e. after the time window) the counter value is compared with the mentioned upper and lower limits $C_{UL}$ and $C_{LL}$ using a digital comparator 42. A locked state is detected when the counter value CNT lies within the range defined by the upper and lower limit $C_{UL}$ and $C_{LL}$. The counter 41 and the comparator 42 may be controlled by a finite state machine 45, which provides an enable signal EN and a reset counter signal RES for counter 41. The time window length $T_{CNT}$ is determined based on the reference signal $S_{REF}$. In the present example, the time window length $T_{CNT}$ is an integer multiple of the period $T_{REF}=f_{REF}^{-1}$ of the reference signal $S_{REF}$. It may be determined using a further counter 40 which receives the reference signal $S_{REF}$. The counter 40 is started by a respective start signal generated by the state machine 45, and the counter 40 supplies a stop signal to the state machine 45 indicating that a predefined counter value N has been reached (e.g. N=512). In the present example, the time window length $T_{CNT}$ is thus $N/f_{REF}$. The state machine 45 may be clocked by the reference signal $S_{REF}$.

Figure 5:
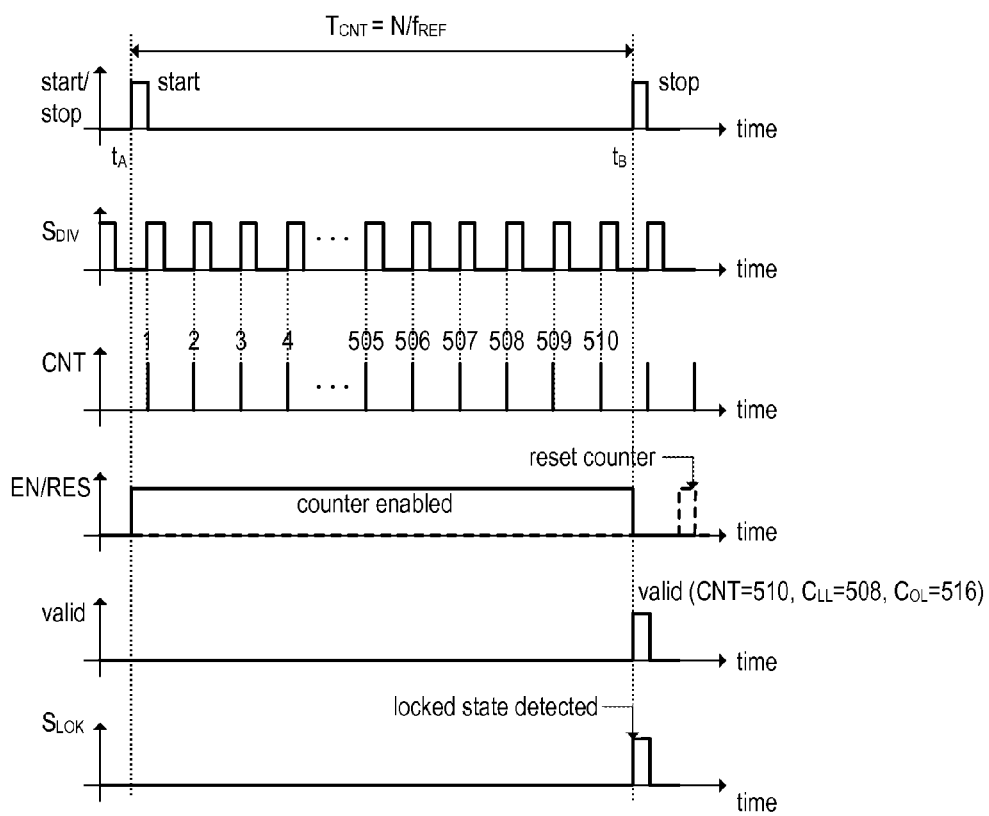
FIG. 5 includes a set of timing diagrams illustrating the operation of the lock detector of FIG. 4.

The function of the lock detector circuit 4 can be better understood with the help of the timing diagrams illustrated in FIG. 5. A lock state detection is triggered by the state machine 45 by generating, at time instant $t_A$, a start command, which is represented by a rising edge in a binary start signal generate by the state machine (see first (top) diagram of FIG. 5). The start command starts the counter 40. Simultaneously with the start command, the other counter 41 is enabled by a respective enable signal EN (see fourth diagram of FIG. 5) thereby "opening" the mentioned time window. Counter 40 counts the rising edges in the reference signal $S_{REF}$ and signals a stop command to the state machine 45 when a defined counter value is reached. For example, a counter overflow signal may be used to signal the stop command to the state machine 45 (e.g. when a counter overflow occurs after a maximum counter value N). When receiving the stop command a time instant $t_B$, the time window "closes", the state machine 45 disables counter 41 (see fourth diagram of FIG. 5) and generates a valid flag for the digital comparator 42 (see fifth (bottom) diagram of FIG. 5). Between time instants $t_A$ and $t_B$ counter 41 counts the rising edges in the frequency divider output signal $S_{DIV}$. The frequency $f_{DIV}$ can be calculated as $f_{DIV}=CNT \cdot f_{REF}/N$ for a time window length $T_{CNT}$ equaling $N/f_{REF}$. As $f_{REF}$ and N are known (and generally fixed) parameters the counter value CNT may be used as a measure of the frequency $f_{DIV}$. It should be noted that the lock detector circuit 4 allows determining the frequency $f_{DIV}$ with a resolution $\Delta f=f_{REF}/N$. That is, the resolution and thus the precision of the lock detection increases with an increasing time window length $N/f_{REF}$. A lock signal $S_{LCK}$ indicating a precisely locked state of the PLL is generated by the digital comparator if the following condition is fulfilled, $C_{UL}<CNT<C_{COL}$. Generally, a locked state is detected when the counter value CNT lies within an interval defined by $C_{UL}$ and $C_{LL}$.

Figure 6:
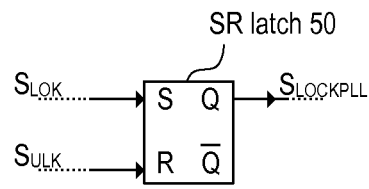
FIG. 6 illustrates how to combine the out-of-lock detector if FIG. 2 and the lock detector of FIG. 4 to obtain a combined lock/out-of-lock-detector.

The lock detector circuit is able to detect a locked state of a PLL very precisely and the precision depends on the time window length $T_{CNT}$ (proportional to N). Therefore, an out-of-lock state can not be detected sufficiently fast. In accordance with the one embodiment, an out-of-lock detector circuit 2 (see FIG. 2) and a lock detector circuit 4 (see FIG. 4) can be combined to make use of both, a fast detection of an out-of-lock state and a precise (but slower) detection of a locked state of the PLL. FIG. 6 illustrates one example of how to combine the out-of-lock detector circuit 4 of FIG. 2 and the lock detector circuit of FIG. 4 to obtain an improved PLL lock detector. Accordingly, a SR latch (set-reset latch) 50 is used to generate the final PLL lock/out-of-lock signal $S_{LOCK-PLL}$, wherein the SR latch 50 is set by lock signal $S_{LOK}$ generated by lock detector circuit 4 of FIG. 4 and reset by out-of-lock signal $S_{OLK}$ generated by out-of-lock detector circuit 2 of FIG. 2.

Figure 7:
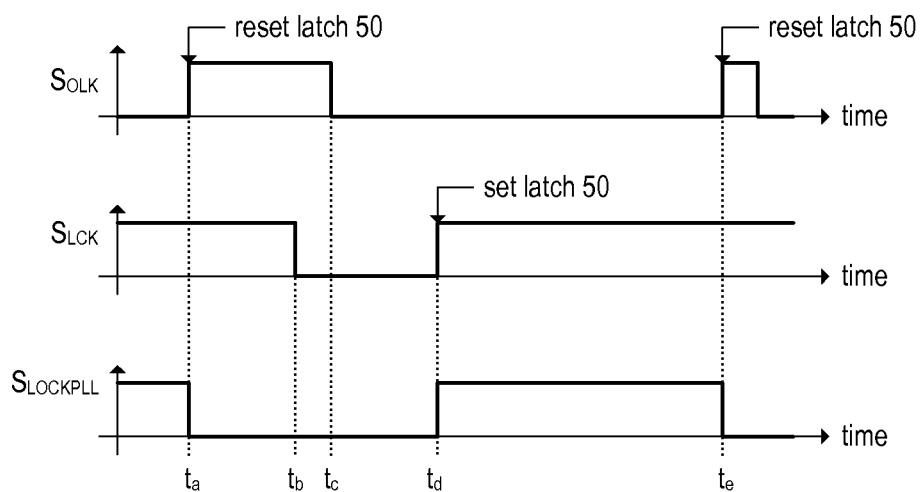
FIG. 7 includes a set of timing diagrams illustrating the operation of the combined lock/out-of-lock-detector of FIG. 6.

The operation of the combined lock/out-of-lock detector is illustrated by the timing diagrams of FIG. 7. The first (top) diagram illustrates the output signal $S_{OLK}$ of the out-of-lock detector circuit 2 of FIG. 2, the second (middle) diagram illustrates the output signal $S_{LCK}$ of the lock detector circuit 4 of FIG. 4, and the third (bottom) diagram illustrates the PLL lock/out-of-lock signal $S_{LOCKPLL}$ of the combined lock/out-of-lock detector of FIG. 6. Is should be noted that the waveform shown in the Figures are merely illustrative and idealized examples. The actual waveforms may look different dependent on the actual application. Furthermore, propagation delays are neglected in the present discussion. For the present example it is assumed that the PLL is in a locked state before time instant $t_a$ and an out-of-lock state is signaled by the out-of-lock detector circuit 2 (see FIG. 2) at time instant $t_a$. Therefore the out-of-lock signal $S_{OLK}$ changes from a low level to a high level at time instant $t_a$ thus resetting the SR latch 50 (see FIG. 6). The reset is triggered by the rising edge of signal $S_{OLK}$, which remains at a high level as long as the out-of-lock detector circuit 2 detects an out-of lock state. As the lock detector is much slower, the output signal $S_{LCK}$ of the lock detector circuit 4 (see FIG. 4) changes from a high level (indicating locked state) to a low level at time instant $t_b$ which is after time instant $t_a$. The closed loop control of the PLL drives the VCO in order to reestablish a locked state. At time instant $t_b$ the out-of-lock detector circuit 2 does not detect an out-of-lock state anymore and the signal $S_{OLK}$ falls back to a low level. As mentioned, this does not necessarily mean that a locked state is established with the desired precision. It takes until time instant $t_d$ until the lock detector circuit 4 detects (and confirms) the locked state of the PLL. As a result, signal $S_{LCK}$ is set back to a high level thus triggering a set of the SR latch 50 at time instant $t_d$. At time instant $t_e$ an out-of-lock state is again detected and the SR latch is reset again (analogous to time instant $t_a$)

Although the disclosure has been illustrated and described with respect to one or more implementations, alterations and/or modifications may be made to the illustrated examples without departing from the spirit and scope of the appended claims. For example, signal $S_{DIV}$ may be taken as reference signal in the described circuits and methods while signal $S_{REF}$ may be taken as second input signal. In particular regard to the various functions per formed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A detector for detecting a locked state and an out-of-lock state of a phase locked loop (PLL), the detector comprising:
    an out-of-lock detector circuit configured to receive a reference signal used by the PLL and an input signal representing a PLL oscillator signal, the out-of-lock detector further configured to detect an out-of-lock state of the PLL and generate an out-of-lock signal indicating whether an out-of-lock state is detected;
    a lock detector circuit configured to receive the reference signal and the input signal, and further configured to detect a locked state of the PLL, and generate a lock signal indicating whether a locked state is detected; and
    a logic circuit configured to receive the out-of-lock signal and the lock signal and further configured to combine the out-of-lock signal and the lock signal to obtain an output signal indicative of whether the PLL is in a locked state or an out-of-lock state.

2. The detector of claim 1, wherein the out-of-lock detector circuit comprises:
    a further logic circuit configured to receive the reference signal and the input signal, and configured to generate an output signal based on the input signal and the reference signal; and
    a sampling unit configured to receive the output signal of the further logic circuit, and configured to sample the output signal to provide the out-of-lock signal.

3. The detector of claim 2, wherein the further logic circuit includes at least one logic gate, which is configured to provide, as the output signal, a logical conjunction of the input signal and the reference signal.

4. The detector of claim 3, wherein the logic conjunction is an AND conjunction or a NAND conjunction.

5. The detector of claim 2, wherein the sampling unit is configured to sample the output signal synchronously to the reference signal or to the input signal.

6. The detector of claim 2, wherein the sampling unit is configured to sample the output signal synchronously to the reference signal, and wherein the output signal is sampled using a sampling period which is delayed with respect to a corresponding period of the reference signal.

7. The detector of claim 1, wherein the lock detector circuit comprises:
    a first counter configured to count cycles of the input signal during a time window thus providing a counter value,
    wherein the time window has a length equal to a predefined number of cycles of the reference signal.

8. The detector of claim 7, wherein the lock detector circuit comprises:
    a digital comparator configured to evaluate whether the counter value of the first counter is within a desired range, which is defined by a lower counter limit and an upper counter limit.

9. The detector of claim 8, wherein the digital comparator is configured to provide a comparator signal indicative of whether the counter value of the first counter is within the desired range.

10. The detector of claim 8, wherein the digital comparator is configured to provide a comparator signal indicative of whether the counter value of the first counter is within the desired range, and wherein the lock signal is generated based on the comparator signal.

11. The detector of claim 7 wherein the lock detector circuit further comprises:
    a second counter configured to count cycles of the reference signal,
    wherein the length of the time window depends on a counter value of the second counter.

12. The detector of claim 7 wherein the lock detector circuit further comprises:
    a state machine coupled to the first counter and configured to control the operation of the first counter.

13. The detector of claim 1, wherein the logic circuit includes a latch.

14. The detector of claim 1, wherein the logic circuit includes a SR-latch, which is set in response to a pulse in the lock signal and reset in response to an out-of-lock signal.

15. A method for monitoring a phase locked loop (PLL), which comprises a frequency divider for providing an input signal based on an oscillator signal, comprising:
    determining whether pulses of the input signal and corresponding pulses of a reference signal coincide within a given range of tolerance;
    signaling an out-of-lock state of the PLL, when the corresponding pulses do not coincide;
    counting the pulses of the input signal during a time window; and
    signaling a lock state of the PLL when the counted number of pulses is within a predefined interval.

16. The method of claim 15, wherein the length of the time window is determined based on the reference signal.

17. The method of claim 15, wherein determining whether pulses of the input signal and corresponding pulses of the reference signal coincide comprises:
    comparing the corresponding pulses and detecting coincidence when two corresponding pulses are at a first logic level at one of a series of sampling time instants.

18. The method of claim 17, wherein the sampling time instants are determined based on the reference signal.

\* \* \* \* \*